United States Patent [19]

Humberstone et al.

[11] Patent Number: 4,893,299
[45] Date of Patent: Jan. 9, 1990

[54] MAGNETO-OPTIC DATA STORAGE TECHNIQUE

[76] Inventors: Victor C. Humberstone, 22, Greenfield Close, Stapleford, Cambridgeshire, United Kingdom, CB3 6RP; Robert M. Pettigrew, Pound Cottage, High Street, Foxton, Cambridgeshire, United Kingdom, CB2 6RP; Peter R. Helfet, 5 Meadow Drive, London, United Kingdom, NW4 1SD

[21] Appl. No.: 688,915

[22] Filed: Dec. 28, 1984

[30] Foreign Application Priority Data

Apr. 28, 1983 [GB] United Kingdom ............... 8311691
Nov. 9, 1983 [GB] United Kingdom ............... 8329859

[51] Int. Cl.$^4$ .............................................. G11B 7/00
[52] U.S. Cl. ................................................. 369/275
[58] Field of Search ............ 346/76 L, 135.1, 137; 358/342; 365/126, 127, 122; 369/109, 110, 111, 275, 276, 13, 14, 15; 428/694, 900; 360/114, 135

[56] References Cited

U.S. PATENT DOCUMENTS

| | | | |
|---|---|---|---|
| 4,359,750 | 11/1982 | Howe | 369/275 |
| 4,489,139 | 12/1984 | Ohta et al. | 428/694 |
| 4,516,234 | 5/1985 | Nakagawa et al. | 369/109 |
| 4,543,301 | 9/1985 | Yazawa et al. | 428/694 |

FOREIGN PATENT DOCUMENTS

| | | | |
|---|---|---|---|
| 57-03228 | 1/1982 | Japan | 360/135 |
| 57-167153 | 10/1982 | Japan | 360/114 |
| WO84/02419 | 6/1984 | PCT Int'l Appl. | 369/13 |

*Primary Examiner*—Donald McElheny, Jr.

[57] ABSTRACT

An optical data storage medium is disclosed for use in an optical read/write system using an optical read wavelength of W, the medium including a textured region having raised areas and depressed areas disposed in a regular array with a period (pitch) not greater than W and a depth (peak-to-trough) in the range 10 to 1,000 nanometers. The medium comprises a substrate and a regular array of zones of magneto-optic material disposed at least over the peaks and troughs of the surface texture and conforming to the surface texture. In many embodiments, there is also a layer or a regular array of zones of an optically reflective material. In one embodiment, the texture is shallow, being generally in the range 10 to 120 nanometers. In a second embodiment, the depth of the texture is at least one tenth of the value of W. In any of the embodiments, there may be a dielectric layer over the top of the structure. The texture can take the form of a grating, or of crossed gratings, or be defined between an array of protuberances; structures with sinusoidal, square-wave (top-hat) or saw-tooth profile are advantageous.

7 Claims, 8 Drawing Sheets

MAGNETO-OPTIC DATA STORAGE TECHNIQUE

CROSS-REFERENCES TO RELATED APPLICATIONS

This is a continuation of International Patent application PCT/GB8400147, filed April 30, 1984 now abandoned. The foregoing International Application is based upon and claims priority from U.K. patent application No. 8,311,691, of April 28, 1983 and U.K. patent application No. 8,329,859 of November 9, 1983. This application is substantially co-extensive with the above-identified International Application, and the priority dates of the International Application and the underlying U.K. Patent Applications are therefore claimed.

FIELD OF THE INVENTION

This invention relates to a data storage medium, and to methods of recording data and reading recorded data from such a medium. In particular, the invention is concerned with magneto-optic techniques.

BACKGROUND OF THE INVENTION

In information storage and retrieval systems, the following characteristics are desirable: (1) to minimise the size of a distinguishable feature in the record (in digital records this is a "bit"); (2) to minimise the energy requirement to write one bit; (3) to maximise the writing speed or number of bits written per second; (4) to maximise the reading speed of recorded information; (5) to maximise the signal level obtained when reading recorded information; (6) to maximise signal-to-noise ratio during reading; and (7) to maximise the contrast between readout of '1' and '0' bits.

Several magneto-optic techniques are in theory suitable for use in information storage. These include magnetic wiring (i.e. recording) followed by optical reading of the recorded material; thermomagnetic writing/magnetic reading; and thermomagnetic writing/optical reading. The present invention is directed particularly to systems using optical reading or thermomagnetic writing (or both). Where the writing step is a thermomagnetic step, the physical effect produced in the medium by writing (i.e. by the recording process) is, at least in part, magnetic and may for example involve local heating of the medium by the absorption of incident electromagnetic radiation. It is one object of the present invention to provide a magneto-optic memory structure with high sensitivity to writing radiation so that the energy requirement for writing one bit is reduced and the writing speed increased.

Where the readout of magneto-optic memory structures is optical, it may be achieved by observing the change in polarisation state of electromagnetic radiation scattered from the surface. The scattering may be direct transmission or reflection, or scattering in other directions. When the readout radiation is linearly polarised, the change in polarisation state of the scattered light may usually closely be described as a rotation of the polarisation direction. This is closely equivalent to the addition of a polarisation component orthogonal to the incident polarisation in the scatter beam (the added component being the so-called "magneto-optic" component).

This magneto-optic component with orthogonal polarisation "carries" the readout information, but is generally of very small intensity. The scattered component with polarisation parallel to that of the incident radiation which carries no information is however, very large. These factors lead to low readout signal-to-noise ratio and low readout contrast which thus limits the usefulness of known magneto-optic memories by reducing the ability to extract stored information from them. In digital storage where "bits" are stored, this can result in a "Bit Error Rate" which is larger than is desired for many applications. It is a second object of the present invention to provide means by which the readout signal-to-noise ratio and contrast may be improved in order to improve the readout "Bit Error Rate".

It is a third object of the present invention to realise the improvements in recording sensitivity and readout "Bit Error Rate" using a magnetic-optic structure that may be formed by reliable production techniques.

There are known in the art several multilayer magneto-optic structures which provide improvements in recording sensitivity and readout reliability. These structures consist of combinations of magneto-optic, dielectric and metallic layers deposited in a closely-planar thin-film form. They absorb a significant fraction of the writing illumination, giving higher writing sensitivity. They also aim to increase the intensity of the (information-carrying) magneto-optic component of the scattered radiation, and decrease the intensity of the "ordinary" reflected radiation (i.e. that component polarization parallel to the incident radiation), giving higher readout reliability. However, further improvement is desired for many applications, especially in the application to computer memories. It is also desired to provide a structure that may be manufactured with higher yields and consequent lower manufacturing costs. The multilayer structures discussed above are difficult to manufacture to the required uniformity of properties within the total storage area of each structure, and between structures.

SUMMARY OF THE INVENTION

According to one aspect of the present invention, there is provided an optical data storage medium for use in an optical read/write system using an optical read radiation of wavelength W, which medium has or includes a region which carries a surface texture including raised areas and depressed areas which are disposed in a regular array with a period (pitch) measured transversely to the mean surface level of not greater than W and a depth (peak-to-trough) in the range 10 to 1000 nanometers, wherein the medium comprises:

(a) a substrate; and
(b) a regular array of zones of a magneto-optic material disposed at least over the peaks and troughs of said surface texture and conforming thereto.

Unless otherwise stated, references herein to the value of wavelength refer to the wavelength in vacuo (which for all practical purposes is the same as the wavelength in air).

Where the zones of magneto-optic material extend over all of the surface texture, they will constitute a magneto-optic film or layer.

The data storage media of this invention may also include a layer or a plurality of zones of an optically reflective material, especially if the magneto-optic material is not itself optically reflective. Such a reflective layer may be positioned above or below the magneto-optic layer (with respect to the substrate). Where there are zones of optically reflective material, these may or may not coincide position-wise with the zones of magneto-optic material.

The substrate will generally be a dielectric material and in many embodiments its upper surface will constitute the above-mentioned textured surface.

Overlying the uppermost of (i) the magneto-optic zones or layer and (ii) the optically reflective zones or layer (where present) there may be further zones or a layer of a dielectric material. Where such a dielectric material is present as a layer, the lower surface thereof (with respect to the substrate) will necessarily conform to the textured surface pattern as far as the presence of materials intermediate the substrate and the dielectric layer in question will allow. The upper surface of the dielectric layer may be planar or it may also conform to the textured surface pattern. The dielectric material which constitutes the zones or layer in question may be, for example, silicon monoxide, silicon dioxide or aluminium nitride. Aluminium nitride is preferred because of its protective properties in reducing the tendency towards oxidation of the material which constitutes the magneto-optic layer. Where a dielectric layer is present and this layer conforms to the textured surface pattern, the thickness of the dielectric layer is preferably about one quarter of the wavelength of the read radiation W measured in the dielectric material itself (because of the relationship between the refractive index of a material and the wavelength of radiation passing through that material, the wavelength in question will differ from the value of W as measured in air or in vacuo).

The thickness of the magneto-optic material will generally be less than 200 nanometers, and is preferably in the range of 5–150 nanometers (nm).

The invention also provides methods for recording (writing) and reading such a data-storage medium. The invention further provides a pre-recorded data storage medium having the structure defined above and recorded by a method in accordance with the invention.

In those embodiments of the invention where the thermomagnetic writing step involves optical radiation, as for example is common in Curie point writing systems an area including (but not limited to) the bit to be written is subjected to a magnetic field. This field is not strong enough to affect the state of magnetization of the magneto-optic material at the general operating temperature of the equipment. In order to effect writing of the bit, the area of the bit is irradiated, while heating the magneto-optic material and enabling the magnetic field to affect its magnetisation.

In many embodiments of the invention, the pitch (P) of the surface texture will be not less than one half of, and not more than eight time as great as, the peak-to-trough depth (D) of the surface texture. In several embodiments, the pitch and depth are approximately equal.

We have found that, when the magneto-optic material is in the form of a thin film deposited on a suitably textured substrate, and the thin film is of a highly reflective material (or is deposited on an intermediate thin film of a highly reflective material such as a metal, e.g. silver or aluminium), the irradiation is absorbed very efficiently. Because of this high efficiency of absorption, the incident energy necessary to raise the temperature of the magnetic material to its Curie point is less than would otherwise be the case. This permits the use of a lower power and hence lower cost irradiation source and/or a shorter irradiation time and hence a higher writing speed. Furthermore, in a medium constructed in accordance with the present invention, the layer of magneto-optic material and of any associated metallic layer may be less than the thickness of corresponding layers in known magneto-optic recording media; this further enhances the advantages just mentioned. Where the texture of the surface is relatively deep, the length of the thermal conduction path for heat to be lost from the area to be recorded is increased. Depending upon the combination of depth of surface texture and deposited film thickness, this may yet further reduce the energy required for writing. Where thermomagnetic writing is used, the substrate will be resilient to the effects of heating to the temperatures needed for recording. Examples of suitable substrates are glass, thermosetting plastics, and high softening temperature thermoplastics. Use of magneto-optic films with low recording temperatures, such as GdCo or TbFe alloys, enable a wider range of materials to be used as the substrate.

When a material according to this invention is used in a system based on optical reading, the effect which is used is preferably a change in the polarisation state of the reflected beam. For example a reading head may be constructed in which plane polarised radiation is incident on the bit to be read. Conveniently the E vector of the incident radiation is in the plane of incidence, and this plane is perpendicular to the length direction of the grooves and ridges of the texture. (Other polarisations are usable but we have found them to be less advantageous).

In those embodiments in which the depth of the texture is much less than its pitch (or period), the preferred direction of magnetisation is substantially perpendicular to the plane of that part of the medium which includes the area of several recorded bits because this permits the use of preferred materials for the magneto-optic layer which are MnBi, GdCo, TbFe, GdTbFe and other rare earth-transition element alloys.

The texture of the surface may take the form of a series of alternate ridges and grooves. These may be linear and parallel, or they may for example be in the form of concentric rings or of concentric spirals. The texture of the surface may comprise two series of linear grooves and ridges disposed mutually at an angle; this angle can approximate to 90 degrees so that the two series are mutually orthogonal.

The surface texture may conveniently be referred to as a grating. The texture may be approximately sinusoidal in cross-section (it will be appreciated that production methods make it difficult to achieve a cross-section which is perfectly sinusoidal). Alternatively, the texture may be approximately of square-wave or saw-tooth profile.

In those embodiments in which the depth of the texture is at least one fifth of the pitch of the grating, then the direction of magnetisation may be parallel to the length directions of the grooves and ridges. In another arrangement the direction of magnetisation may be perpendicular to the plane of that part of the medium which includes several recorded bits (i.e. as with a shallow grating). In yet another arrangement the direction of magnetisation varies within the area of one bit, in that it is perpendicular to the length direction of the grooves and ridges and, at any point within the area of the bit, is perpendicular to the surface element at that point. That is to say, it varies from point to point on the profile of the groove and ridge.

For those embodiments in which the depth of the grating is at least one fifth of the pitch of the grating, there is a very large variety of magneto-optic materials which are suitable.

When using linearly-polarised incident radiation, the reflected radiation has its plane of polarisation rotated with respect to that of the incident beam. When the direction of magnetisation is reversed the direction of rotation of the plane of polarisation of the reflected beam with respect to that of the incident beam is reversed. This makes it possible to distinguish between the binary characters 1 and 0 which are represented by opposite directions of magnetisation.

The Kerr component of the reflected beam (i.e. the resolved component whose polarisation is perpendicular to that of the incident beam) is usually much smaller than the component whose polarisation is unaltered, and in practice, due to noise in the polarisation state of the scattered radiation, the difference between a written 1 and 0 may be difficult reliably to distinguish from the high background level (the component of unaltered polarisation).

When using a recording medium constructed according to the present invention, reading is simplified and much more certain, for two reasons:

(a) The intensity of the component of the reflected beam whose polarisation is unchanged is very much reduced.

(b) The intensity of the Kerr component is much increased. For example, measurements on the shallow-grating textured surfaces have revealed an increase in Kerr component of more than 7.5 times, and an associated reduction of the unrotated polarisation component by a factor of 2. Similarly the deep-grating textured surface exhibits a ten-fold increase in Kerr component and a decrease in the intensity of the unrotated polarisation component. The phase of the Kerr component may be altered with respect to the unaltered component, resulting in elliptical polarisation of the reflected beam. This ellipticity may be removed if desired, by a suitable phase plate.

For better understanding of this invention, a number of particular embodiments will not be described in general and specific terms with reference to the accompanying drawings.

DESCRIPTION OF THE PREFERRED EMBODIMENTS

Figure 1:
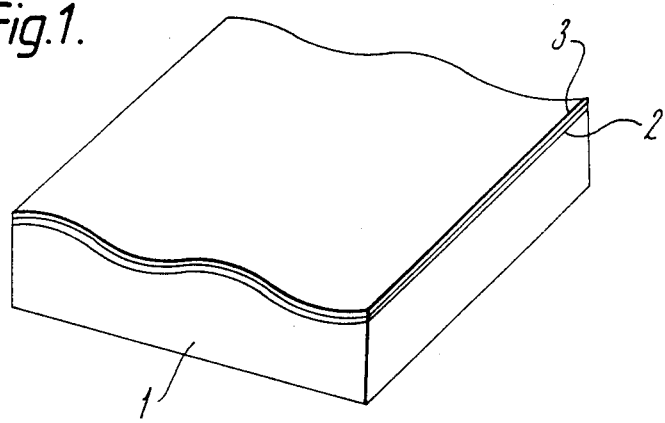
FIG. 1 represents an enlarged section through a first embodiment.

The various embodiments illustrated in the drawings are depicted schematically and not to scale.

According to one embodiment of the present invention, there is provided a data storage medium comprising a substrate having a slightly textured surface coated with a thin film of a metal which conforms to the texture of the surface end, on top of said thin film of metal, a thin film of magneto-optic material which also conforms to the texture of the substrate surface. If the magneto-optic film is itself highly reflective, the thin metal film may be omitted. Preferably, the magneto-optic film has a thickness in the range of 5-150 nm. One such structure is shown by way of example in FIG. 1. The depth of the texture (e.g. the peak to trough dimension where the surface is in the form of a grating) may be very small, and will generally be less than W/4 nm, where W is the readout radiation wavelength (in nanometres); it may be for example in the range of 10-50 nm. With a readout radiation wavelength of 633 nm, the preferred depth is in the range 10-150 nm. Alternatively, the depth of the texture may be between W/4 and W nm, e.g. it may be in the range 50-200 nm. The mean pitch of the texture will usually be smaller than or equal to the wavelength of the writing or reading radiation. The metal which constitutes the thin film between the substrate and the magneto-optic film is preferably silver, gold, copper or aluminium. This film may, for example, have a thickness in the range 10 to 100nm; preferably the film thickness is in the lower part of this range. The magneto-optic film may be overcoated with a thin metallic film of, for example, silver, gold, copper or aluminum. The thickness of such an overcoating film may be in the range 5 to 30 nm.

The texture of the surface may be in the form of a series of alternate grooves and ridges which are substantially parallel. For convenience, though not essentially, these may be uniformly spaced and of uniform depth and shape. Such a surface will be referred to herein as a grating since it is similar to surface relief diffraction gratings which are well known in the spectroscopic art. The texture may consist of two such gratings disposed mutually at an angle. The gratings may be disposed mutually orthogonally. Such a textured surface is referred to as a crossed grating. Many methods of making such gratings are known and include photolithography of an interference field, mechanical ruling and replication from a pre-existing surface.

Many embodiments of the present invention are susceptible of relatively simple mass production. They can be made by suitable process steps from a master which carries the desired surface texture. In general, methods such as embossing, casting and stamping from the master are suitable. The master itself may be made using a tool which is formed exactly to the desired surface profile. One technique for manufacturing a data storage medium in accordance with the present invention is as follows, starting with the production of the tool:

(1) A thin film of resist is deposited onto a smooth surface.

(2) The resist is exposed in a pattern which corresponds to the desired surface relief.

(3) The resist is developed.

(4) A negative replica of the resist surface is produced by first forming a thin electrically conducting layer on the resist and by electroplating onto that layer a further layer of metal thick enough to be durable.

(5) The electroplated metal layer from the resist may then be stripped from the resist, although this is not essential.

(6) Forming an electroplated positive metal replica (to act as a master) from the negative metal replica (which constitutes the replicating tool).

(7) Forming a plastics replica from either the positive or directly from the negative metal replica.

(8) Depositing the desired layers or zones of materials, e.g. a thin metal film to act as the mirror layer followed by a thin film of magneto-optic material, on the plastics replica. This metallised plastics replica provides a strongly absorbtive surface, ready for writing, and constitutes the data storage medium, which may function for example as a digital or analogue information storage medium. Steps (7) and (8) can be repeated in a mass-production process.

Within the scope of the above process many variations are possible:

Step (1) The resist may be for example photoresist or electron beam resist. It may be deposited for example by spinning, dipping, spraying or any other suitable technique.

The surface on which it is deposited may be flat or curved e.g. cylindrical, conical, spherical or other suitable shape.

Steps (2/3) The pattern must satisfy the requirements set forth above in relation to the textured surface pattern of the data storage medium. The pitch need not be uniform, but the pattern must be regular, i.e. repeating. The pattern may be imaged onto the resist by any one of a variety of methods, including writing with an electron beam, or by the production of interference fringes either as a pattern of parallel bars or as two patterns of bars at an angle (possibly 90°) to each other. Laser interference is a valuable technique for generating an array of intersecting grooves or a set of concentric grooves. For example, two laser beams may be focussed in one dimension to form an interference pattern in the form of a series of spots. The resist-coated substrate may be moved (e.g. by rotation or translation or by a combination of rotation and translation) beneath this interference pattern to generate the desired exposure. Electron beam recording is another valuable technique which can be used with either the single spot recording or multiple spot recording techniques. Another recording technique of use in the production of data storage media of this invention involves recording harmonic fringes generated by a diffraction grating. The diffraction grating itself may have circular, spiral or straight-line rulings, and is illuminated with collimated light. This produces images in the form of harmonics of the grating at set distances from the grating, and these images result in exposure of the photoresist.

Step (4) An alternative first stage is to produce a negative first stage replica using the techniques common in replication of ruled spectroscopic gratings e.g. first applying a very thin coat of a release agent such as mannitol to the original, and casting a layer of a thermosetting plastics against it. This technique causes minimum damage to the original, so that several first generation replicas may be obtained.

Step (7) The product replica may be formed from the metal tool by any one of a number of processes including casting, injection or compression moulding or embossing, the last two using such details of technique as are well known in the arts of gramophone record or videodisc manufacture.

Instead of using a resist which is exposed and developed in order to generate the desired textured surface pattern, steps (1)-(3) above can be replaced by a mechanical cutting or an optical cutting step which generates directly the desired textured surface pattern in a plastics or metal substrate. Mechanical cutting may be formed using an a piezo-electrically driven stylus. Optical cutting can be achieved using UV lasers and appropriate optics or multiple spot techniques. Radial gratings may be produced by modulating the laser beam with such a technique. Cutting may also be effected directly using an electron beam.

We have found that materials which are suitable for use as the magneto-optic layer include transition elements, rare earth elements, alloys of at least one rare earth element and at least on transition element, and alloys of at least one transition element and at least one semi-metal. Examples of materials which work satisfactorily are iron, cobalt, nickel, terbium-iron, gadolinium-cobalt, and manganese-bismuth. One particularly favoured material is an amorphous or disordered alloy of terbium-iron which can possess a magnetisation normal to the film plane when prepared under favourable conditions.

The dielectric constant of at least one of the magneto-optic material and the optically reflective material should preferably have a negative real part and a small imaginary part at the frequency of the radiation in question.

In the specific example of this first embodiment illustrated in FIG. 1, the substrate 1 is formed of a dielectric material and has its upper surface textured. The form of that surface is a sine wave, pitch =580 nm and peak to valley height =33 nm. A layer of aluminium 2 which is 20 nm thick is deposited on the substrate. A layer of terbium-iron 3 which is 25 nm thick is deposited on the aluminium. The TbFe layer is deposited by any of the well known methods which either produce an amorphous layer, or a layer which, by a subsequent heat treatment, can be made amorphous. We have found vacuum sputtering, with a residual oxygen pressure less than 100 nanoTorr to be suitable.

In a similar example, intended for use with a readout radiation of wavelength 633 nm, the pitch of the texture is 612 nm and the depth (peak-to-trough) is 110 nm. In a further example, intended for use with a readout radiation of wavelength W=820 nm, the pitch of the texture is 794 nm and the depth (peak-to-trough) is 115 nm. The dimensions of layers 2 and 3 are as given in relation to FIG. 1.

In a variation of the embodiment illustrated in FIG. 1, the metallic mirror layer 2 is omitted. The structure and its dimensions are otherwise the same. Two examples of this variant structure both have a layer of TbFe as the magneto-optic material, the layer being 25 nm thick; the first example is intended for use with a readout wavelength of W=633 nm, and has a texture with a pitch (P) of 612 nm and a peak-to-trough depth (D) of 110 nm. The second example is intended for use with a readout wavelength W=820 nm, and has the parameters P=794 nm and D=115 nm.

Figure 2:
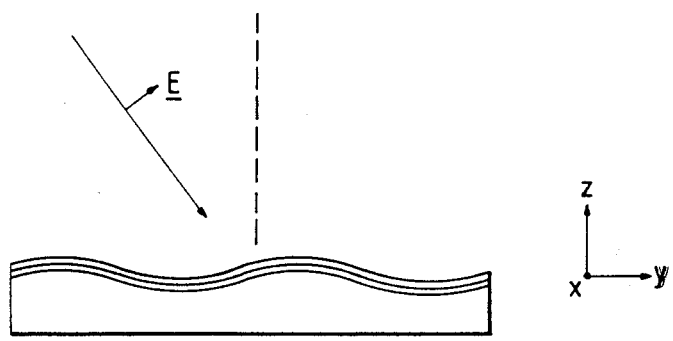
FIG. 2 shows a preferred readout configuration of the embodiment of FIG. 1.

The shallow-texture structure of this first embodiment of the invention provides increase in readout reliability when the illumination has electric vector E linearly polarised parallel to the plane of incidence as shown in FIG. 2. We refer to this as polarisation in the plane of incidence. When the surface texture takes the form of a grating the readout beam polarisation should preferably also be closely perpendicular to the grating lines. (This is unnecessary when the texture takes the form of two gratings crossed approximately at right angles).

The physical laws governing the improvements with the shallow-grating textured surfaces described above are not yet completely understood. To the best of our understanding there is an increased interaction between the radiation and the magnetic layer due to the surface texture. This may be caused by plasmon or magneto-plasmon excitation, which causes both a reduced reflection of the unaltered component and an enhanced intensity of the Kerr component. Where it is desired to use films of thickness in the range 10 nm to 120 nm together with a magnetisation that is most naturally directed perpendicular to the substrate, we have found amorphous alloys of TbFe to be particularly suitable.

For readout of small recorded bits, typically having linear dimensions 400 nm to 5000 nm in size, readout illumination of wavelength 400 nm to 1000 nm is highly focussed and therefore impinges on the surface from a wide range of angles. This illuminating radiation has a smooth variation of intensity across this angular range.

Figure 3A:
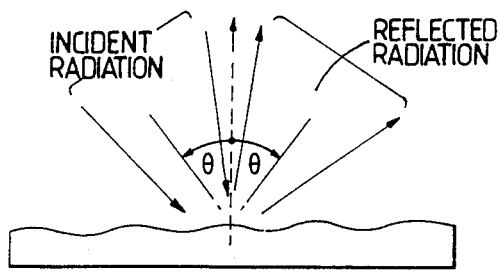
FIGS. 3(a), 3(b) and 3(c) illustrate the reflectivity anomaly of embodiments such as that of FIG. 1.
Figure 3B:
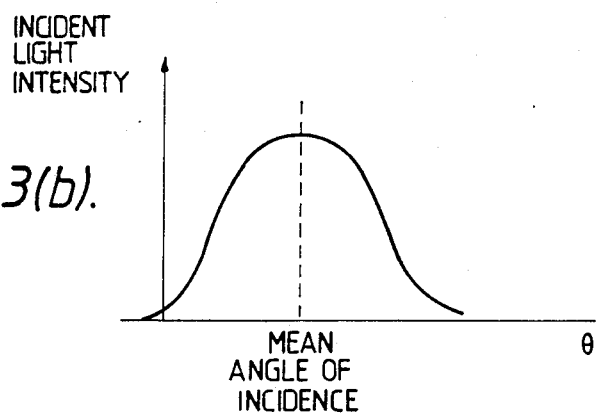

The radiation reflected from the surface also emerges in a range of angles, with a primarily smooth variation in intensity across the angular range, but over a small portion of that angular range there may be observed a strong dip in intensity. This is shown in FIGS. 3 (a), (b), (c). A photo-detector viewing at the angular position of this dip (through an appropriately oriented analyzer) observes a much increased intensity of the information-carrying magneto-optic component. It also observes a much reduced intensity of radiation component polarised parallel to the incident radiation (the ordinary reflectivity component). As a result both the readout contrast and the readout signal-to-noise ratio are greatly improved. Accordingly, the invention further provides a method of reading data stored on a data storage medium which method comprises monitoring the intensity of the magneto-optic signal within the angular range over which there occurs a sharp reduction (dip) in reflectivity as the surface of the medium is observed or scanned with the read-out illumination.

Figure 4:
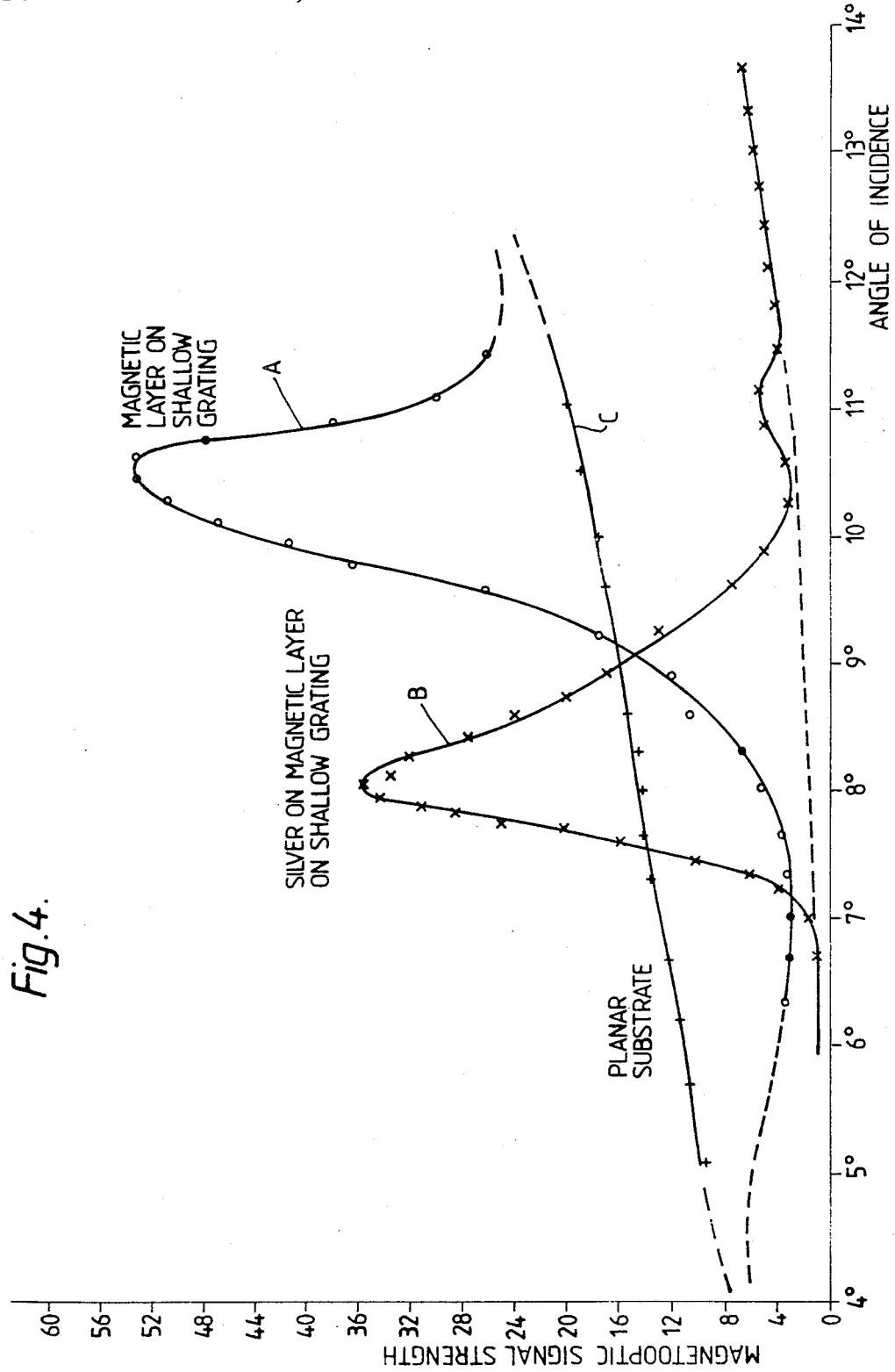
FIG. 4 illustrates graphs of the reflected output for different media.

FIG. 4 shows experimentally-measured graphs of the intensity of the information-carrying component at and close to this dip in surface reflectivity. In FIG. 4, plot A is for a magneto-optic layer on a shallow grating surface such as that of FIG. 1; plot B is for a similar structure, but with a layer of silver on top of the magneto-optic layer; and plot C is for a planar substrate.

If the surface reflectivity dip is very sharp, which occurs for highly-reflective metallic or magnetic metallic layers on the surface texture, then the position of the dip noticeably changes upon reversal of the magnetisation direction of the magnetic layer. An alternative readout method is, therefore, the measurement of the angular position of the reflectivity dip. This may conveniently be employed using circularly polarised readout radiation. Accordingly the invention also provides a second method of reading data stored on a data storage medium, which method comprises monitoring the angular position at which there occurs a sharp reduction (dip) in reflection from the medium as the surface thereof is observed or scanned with the read-out radiation. We have not found this approach as useful in obtaining high readout signal-to-noise ratios as the first method.

The origin of the reflectivity dip is attributed to the excitation of collective electronic motion (surface polaritons or plasmons) in the magnetic film by the incident radiation, the surface texture enabling efficient coupling between the incident radiation and this collective electron motion.

The shallow textured surface of the first embodiment provides strong absorption over a narrow range of angles, giving a small improvement to writing sensitivity.

We have obtained best results on readout using radiation of 633 nm from the shallow textured surface when the surface is in the form of a sinusoidal profile of depth 25–140 nm, and a period slightly smaller than the wavelength of the readout illumination. Examples of magnetic film that are found to be suitable include cobalt, terbium-iron, and gadolinium-cobalt; and of thickness in the range of 5 nm to 50 nm. Under these conditions we have obtained 7.5 - fold enhancement in the intensity of the magneto-optic component and a two-fold reduction in the intensity of the ordinary reflected component.

For a practical erasable data storage and retrieval medium the "polar" configuration, in which the direction of magnetisation lies perpendicular to the means surface plane, is preferred because this permits the maximum recording density. In this arrangement preferred materials for the magnetic layer are MnBi, GdCo, TbFe, GdTbFe and other rare earth-transition element alloys.

Figure 5A:
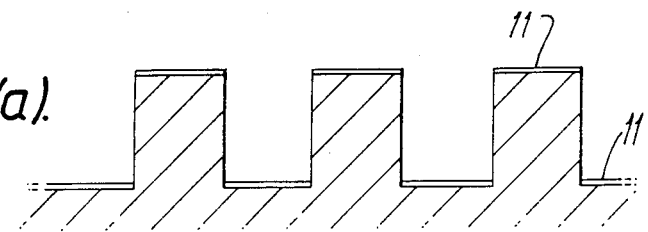
FIGS. 5(a), 5(b) and 5(c) illustrate deeply-textured media in accordance with a second embodiment of the invention.
Figure 5B:
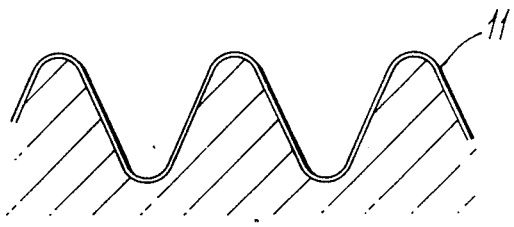
Figure 5C:
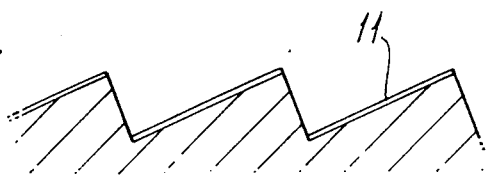

According to a second embodiment of the invention there is provided a data storage medium comprising a substrate having a more deeply textured surface coated with a thin magnetic film which conforms to the texture of the surface. The texture preferably has a mean spatial dimension smaller than the wavelength of the readout radiation and preferably has a depth at least one tenth of the wavelength of the readout radiation, and more preferably at least one sixth thereof. We have found grating profile depths in the range 0.25 W to 0.5 W, where W is the wavelength of the writing or reading illumination, to be particularly advantageous. In the case where the surface is a surface-relief grating the mean spatial dimension is the grating pitch. The surface relief may take the form of a single grating or of two or more gratings disposed mutually at an angle. With two gratings, they may be disposed mutually orthogonally. We have found a single grating to be particularly advantageous. The thin magnetic film may be continuous or discontinuous on the textured surface. Possible examples of this structure are shown in FIGS. 5 (a), (b) and (c). In this and all subsequent Figures, 11 refers to the magneto-optic layer, and 12 to the metallic mirror layer.

According to a third embodiment of the invention there is provided a data storage medium comprising a substrate having a textured surface of similar depth, period and profile to that described in the second aspect of the invention. This textured surface is coated with a thin metallic film which in turn is coated with a thin magnetic film, both film layers conforming to the texture of the surface. Either or both film layers may be continuous or discontinuous. Examples of this structure are shown in FIGS. 6 (a)–(e) for the top-hat and sinusoidal profiles. Advantageously, the mirror layer is, in the case of the top-hat profile embodiments, located so that the averaged electromagnetic or optical path length between the mirror layer and the lower magneto-optic film, including phase changes that occur at the interface of two optically different media, is approximately an odd number of quarter-wavelengths of the read or write radiation. In the specific example illustrated in FIGS. 6(c), the texture has a pitch of 300 nm, a depth (peak to valley) of 400 nm, and is approximately sinusoidal in shape. The dielectric substrate was coated first with a 30 nm layer of aluminium then with 35 nm of terbium-iron.

Figure 7A:
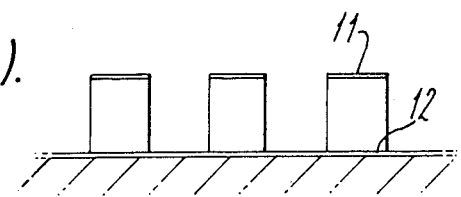
FIGS. 7(a) to 7(d) illustrate deeply-textured media in accordance with a fourth and fifth embodiment of the invention.
Figure 7B:
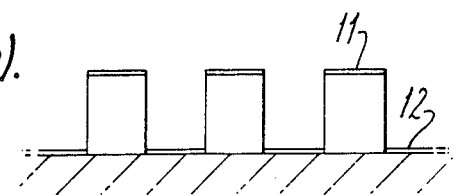

According to a fourth embodiment of the invention a metallic thin film may be deposited on a planar substrate and coated with a dielectric layer that provides a textured surface of similar depth, period and profile to that described in the second aspect of the invention. The dielectric layer is then coated with a magnetic thin film. Either or both film layers may be continuous or discontinuous. Examples of this structure are shown in FIGS. 7(a) and 7(b), for the top-hat profile.

Figure 7C:
Figure 7D:
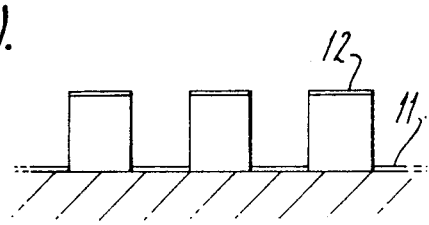

According to a fifth embodiment of the invention a magnetic thin film may be deposited on a planar substrate and coated with a dielectric layer that provides a textured surface of similar depth, period and profile to that described in the second aspect of the invention. The dielectric layer is then coated with a metallic thin film. Either or both film layers may be continuous or discontinuous. FIGS. 7(c) and 7(d) show examples of this aspect of the invention.

Figure 3C:
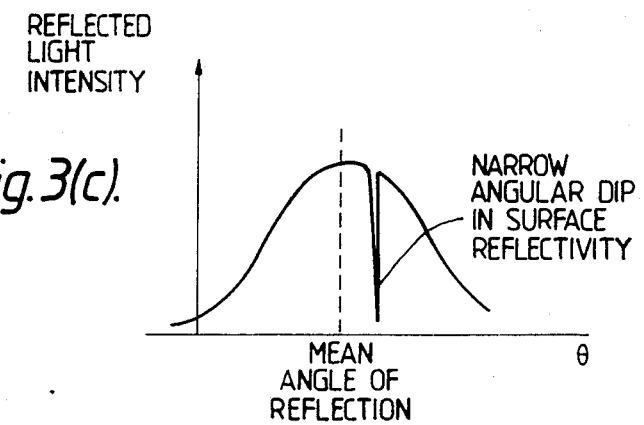
Figure 8:
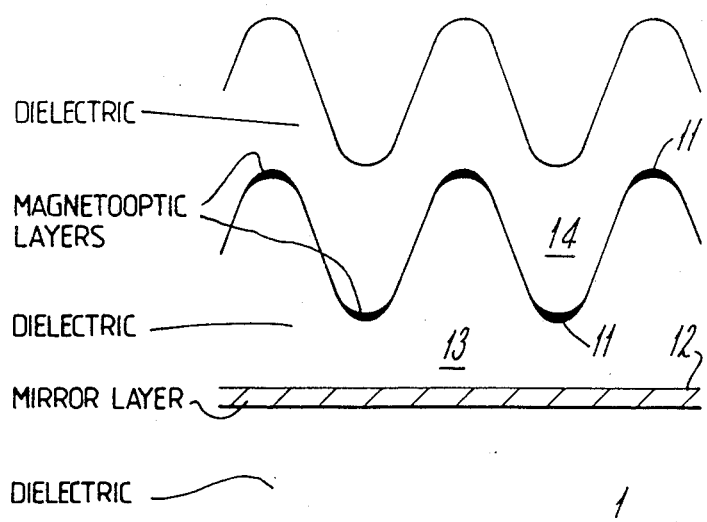
FIG. 8 illustrates a medium in accordance with a sixth embodiment of the invention.

According to a sixth embodiment, a structure of the type defined in any of the first to fifth embodiments is overcoated with a dielectric material. The presence of a dielectric layer is beneficial in protecting the magneto-optic layer. Also, with the shallow grating structures, the thickness of the layer can be tuned to give further inference enhancement of the magneto-optic signal. With the deeper grating structures, the presence of an overcoating dielectric layer broadens the angle at which there occurs the sharp dip in surface reflectivity as illustrated in FIG. 3(c); typically the range may be increased from about 1° to about 3°. With such a structure, at least the lower surface and in some examples both upper and lower surfaces of the coating dielectric layer conforms to the textured surface of the substrate plus magneto-optic and/or metallic films. FIG. 8 shows an example of such a structure. In this example, the substrate 1 is a dielectric material (e.g. polymethylmethacrylate) of thickness about 1 millimetre onto which is coated a mirror layer 12 of silver or aluminium about 50 nm in thickness. An intermediate dielectric layer 13 formed also of polymethylmethacrylate is formed over the mirror layer 12 and is shaped to the sinusoidal surface texture, as illustrated, by known techniques. The maximum depth of layer 13 is about 800 nm. Zones of a magneto-optic material 11 are deposited on the crests and in the troughs of the sine-wave texture; the maximum depth of the magneto-optic material (amorphous TbFe) is 20 nm. On top of these zones there is deposited a further dielectric layer 14 formed of aluminium nitride. This layer 14 conforms to the texture and is preferably approximately W/4 nm in thickness, where W is the readout radiation as measured in the dielectric layer 14. Thus for a value of W (in air) of 633 nm, and with a dielectric layer 14 of refractive index equal to 2.2, the thickness of layer 14 is about 70 nm. The depth (peak-to-trough) of the texture in this example is close to the pitch; the former is 220 nm and the latter is 300 nm.

Figure 9:
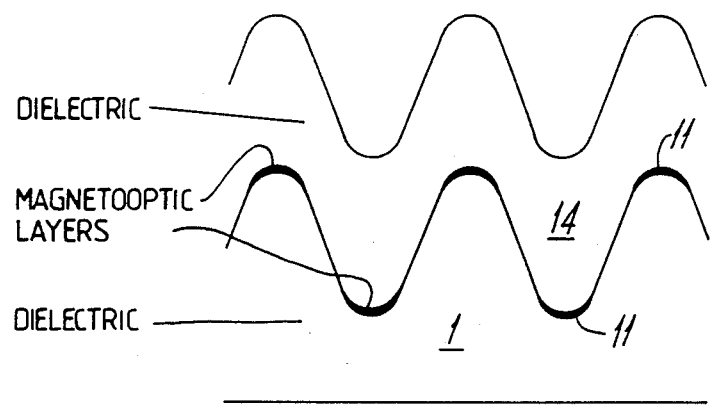
FIG. 9 illustrates a second medium in accordance with the sixth embodiment of the invention.

The structure shown in FIG. 9 consists of a substrate 1 having a sinusoidal surface texture onto the peaks and troughs of which zones of magneto-optic material are deposited. Over these zones, and conforming to the surface texture, there is formed a further dielectric layer 14 of aluminium nitride or silicon dioxide. The thickness of layer 14 is one quarter of the value of the readout radiation W measured in the dielectric material. This value is that for the wavelength in vacuum divided by the refractive index of the dielectric material. Two examples of media in accordance with this embodiment of the invention are as follows: firstly, for use with a readout radiation of wavelength W=633 nm, the pitch (P)=612 nm and the peak-to-trough depth (D)=80 nm; secondly, for use with a readout radiation of wavelength W=820 nm, P=794 nm and D=85 nm. In both examples, the magneto-optic material is amorphous terbium-iron and the average thickness of the zones thereof is 20 nm; similarly, the layer 14 is aluminium nitride and has an average thickness of about 70 nm.

In all of the embodiments of the invention, an overcoating layer may be deposited on top of the other layers in order to prevent mechanical damage and to prevent dust and dirt reaching the operative layers of the medium. Such a capping layer can conveniently be a plastics material, e.g. polymethylmethacrylate or a polycarbonate; it may be from several e.g. 10 microns in thickness up to about 2 millimetres in thickness. An alternative to the presence of a protective layer as part of the structure of the medium itself is to ensure that a protective cover, e.g. a plastics film, is suspended close to the surface of the medium when the medium is in use.

In each of the second, third, fourth, fifth and sixth embodiments of the invention the surface texture may most conveniently take the form of a top-hat (square-wave) or crossed top-hat profile or sinusoidal surface-relief grating or crossed sinusoidal surface-relief grating, although other profiles, for example a triangular or sawtooth profile, are also intended to fall within the scope of this invention. In each case, we have found that particular advantage in either the writing or reading (or both) of data can be achieved when the depth of the grating lies in the range 0.25 times to 0.5 times the wavelength of the writing or reading illumination. For writing, either a crossed grating or a single grating profile confers advantage. For readout, a single grating profile is preferred.

When writing on a single grating profile, we find that, for radiation linearly polarised perpendicular to the grating lines, nearly complete absorption occurs, with very little reflectivity. This high absorption occurs over a wide range of angles of incidence so that even with a very small recorded spot size for which a tightly-focussed cone of radiation is required, almost all the incident radiation energy can be utilised for thermomagnetic recording, giving very high writing sensitivity.

When writing on a crossed grating profile, nearly complete absorption occurs for any polarisation of the incident radiation, again over a wide range of angles of incidence, and very high writing sensitivity is achieved.

For readout from a single grating profile, readout radiation polarised perpendicular to the grating lines gives a very low intensity of the "ordinary" reflection component. Furthermore the high absorption of energy that this represents may produce a much increased magneto-optic component intensity. These combine to give a much increased polarisation rotation angle of the reflected readout illumination. Over a wide range of angles of incidence, we commonly find a fourfold or a fivefold increase in rotation angle over that obtained from a planar magneto-optic film on a planar (non-textured) substrate surface. In general, both the contrast and signal-to-noise ratio on readout from the structure are greatly enhanced.

The deeper grating structures have low reflectivity and high absorption due to phase cancellation of radiation energy in reflection from the structure. The absorption appears to occur primarily in the magneto-optic layer, enabling high sensitivity for recording. The same mechanism also provides an increased electric field within the magneto-optic layer, in turn leading to an enhanced magneto-optic interaction.

Figure 6A:
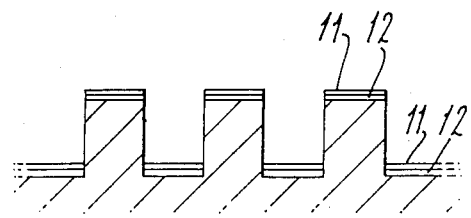
FIGS. 6(a) to 6(e) illustrate deeply-textured media in accordance with a third embodiment of the invention.
Figure 6B:
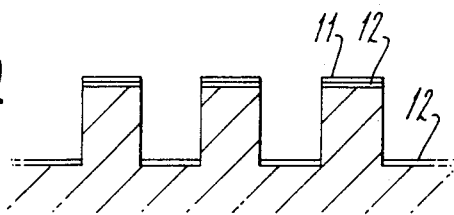
Figure 6C:
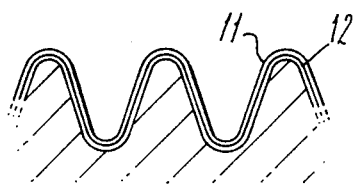
Figure 6D:
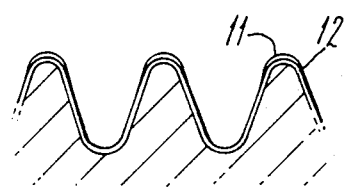
Figure 6E:
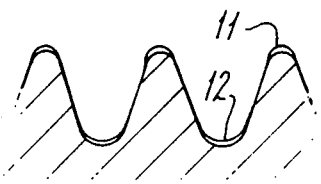

Excellent performance has been achieved with the structures illustrated in FIGS. 6(b), (c), (d) and (e) and FIGS. 7(a)–(d) as the surface texture, using writing and readout radiation polarised in the plane of incidence and perpendicular to the grating lines. For a writing and readout radiation wavelength of 633 nm the preferred pitch and depth of the sinusoidal structure is 150–400 nm, and that for the top-hat structure is 120–300 nm. The thin metallic mirror layer should have thickness adequate to be opaque but should not significantly "infill" the structure. Using a aluminium as the mirror layer, a thickness of 15–50 nm is appropriate. Upon the crests of the structure is deposited the magnetic layer (which is, therefore, discontinuous across the surface profile), which typically is of thickness in the range of 10–50 nm, and which may be any of the rare-earth-transition element alloys discussed above for the shallow-textured surface in the first embodiment.

The other structure described also provide large improvements in readout performance, but to date we have not observed enhancements as large as those provided by the structures of FIGS. 6(b), (d), (e) and 7(a–(d).

The sinusoidal and top-hat structures are preferred for two further production reasons. Firstly the magnetic layers on both types of profile are substantially planar so that the magnetisation direction of the recorded bits is well-defined with respect to the readout illumination, giving maximum magneto-optic signal. Secondly, these profiles may be fabricated using either photolithography of an interference field or mechanical ruling or replication from a pre-existing surface. In particular for the structures shown in FIGS. 5 and 6 a "master" grating profile medium can be produced by, for example, the technique of photolithography of an interference field, and electroplating, and many replicas of the profile can be produced by such techniques as embossing, casting, injection moulding, and compression moulding. This gives ease of reliable and repeatable production with high yields.

The magneto-optic layers may alternatively be formed by sputtering or evaporating (at low pressure) a controlled amount of the magneto-optic material onto the textured surface at a controlled angle of deposition.

Materials that we have found suitable for the dielectric (e.g. substrate) layers include polycarbonates, photoresists, polymethylmethacrylate and high-temperature nylons, and polyesters. These materials can simply replicate an existing grating surface profile, by such well known means as embossing and casting. It is possible by these means to replicate a "master" grating surface many times. The dielectric grating profiles does not, therefore, have to be constructed for each memory structure. This ease of preparation of the grating profile is to be compared with the fabrication of the multilayer structures, where the fine tolerances required are difficult to achieve and must be reproduced during the manufacture of every structure. In the structures according to this invention, the fine tolerances must be satisfied for the master grating. However, once this is achieved subsequent reproduction of that grating within those tolerances is easily accomplished. The master grating may, for example, take the form of a nickel-electro-plating of a grating formed by photolithography, mechanical cutting or other means. The materials listed above by way of example also can withstand without damage the elevated temperatures required for recording information onto and erasing information from the presently preferred magneto-optic materials. Other dielectric materials capable of this include glasses but it is generally less easy to replicate the grating profile of a master grating onto such materials.

Materials that we have found suitable for the high-reflectivity metal layers of the structure include silver, gold, copper and aluminium. Other metals may be similarly effective.

We claim:

1. An optical data storage medium for use in an optical read/write system using an optical read radiation of wavelength W, comprising:

a medium including a region which carries a surface texture including raised areas and depressed areas which are disposed in a regular array with a period (pitch) measured transversely to the mean surface level of not greater than W and a depth (peak-to-trough) in the range 10 to 1,000 nanometers, and wherein the medium comprises (a) a substrate, and (b) a regular array of zones of a magneto-optic material disposed at least over the peaks and troughs of said surface texture and conforming thereto; and the texture of the surface being in the form of a series of alternate grooves and ridges which are substantially parallel and are in the form of concentric rings or concentric spirals.

2. A medium as claimed in claim 1, which further comprises a regular array of zones, or a layer, of an optically reflective material.

3. A medium as claimed in claim 2, wherein said optically reflective material is disposed below the magneto-optic material.

4. A medium as claimed in claim 2, wherein said optically reflective material is disposed above the magneto-optic material.

5. A medium as claimed in claim 1, wherein the magnetooptic film is overcoated with a thin metallic film which constitutes the optically reflective material.

6. A medium as claimed in claim 5, wherein the thin metallic film is 5 to 30 nanometers in thickness.

7. A medium as claimed in claim 1, wherein the medium further includes an dielectric layer overcoating.

* * * * *